United States Patent [19]
Samuels et al.

[11] Patent Number: 5,424,670
[45] Date of Patent: Jun. 13, 1995

[54] PRECISION SWITCHED CAPACITOR RATIO SYSTEM

[75] Inventors: Howard R. Samuels, Newton; Scott H. Wayne, Sharon, both of Mass.

[73] Assignee: Analog Devices, Inc., Wilmington, Mass.

[21] Appl. No.: 167,540

[22] Filed: Jan. 24, 1994

[51] Int. Cl.⁶ .................. H03K 5/00; H03K 17/14
[52] U.S. Cl. .................. 327/337; 327/554
[58] Field of Search ............. 328/127, 151; 307/353; 327/337, 554, 91

[56] References Cited

U.S. PATENT DOCUMENTS

| | | | |
|---|---|---|---|
| 4,393,351 | 7/1983 | Gregorian et al. | 328/127 |
| 4,508,982 | 4/1985 | Kapral et al. | 307/572 |
| 4,520,283 | 5/1985 | Sasaki et al. | 307/510 |
| 4,543,546 | 9/1985 | Hariharan | 328/167 |
| 4,698,596 | 10/1987 | Haigh et al. | 327/337 |
| 4,845,383 | 7/1989 | Iida | 307/353 |
| 5,258,664 | 11/1993 | White | 307/353 |

OTHER PUBLICATIONS

Solomon, *Switched-capacitor filters: precise, compact, inexpensive,* IEEE Spectrum Jun. 1988, pp. 28–32.

Krummenacher, *Micropower Switched Capacitor Biquadratic Cell* IEEE Journal of Solid State Circuits, vol. SC-17, No. 3, Jun. 1982, pp. 507–508.

Hsieh et al, *A Low-Noise Chopper-Stabilized Differential Switched-Capacitor Filtering Technique,* IEEE Journal, vol. SC-16, No. 6, Dec. 1981, pp. 708–709.

*Primary Examiner*—Timothy P. Callahan
*Assistant Examiner*—Terry L. Englund
*Attorney, Agent, or Firm*—Joseph S. Iandiorio; Kirk Teska

[57] ABSTRACT

A precision switched capacitor ratio system includes a capacitor; a switching device for selectively interconnecting the capacitor with one of a plurality of charging circuits and alternately connecting it with a discharge circuit for discharging the capacitor between each interconnection with a charging current; an integrating device interconnected with the capacitor for averaging the current during the charging and discharging of the capacitor for defining the switched capacitor equivalent resistance; and a clock device for providing synchronized clock signals for operating the switching device to precisely define the ratio of the frequencies of the interconnection of the capacitor with each of the charging circuits.

10 Claims, 4 Drawing Sheets

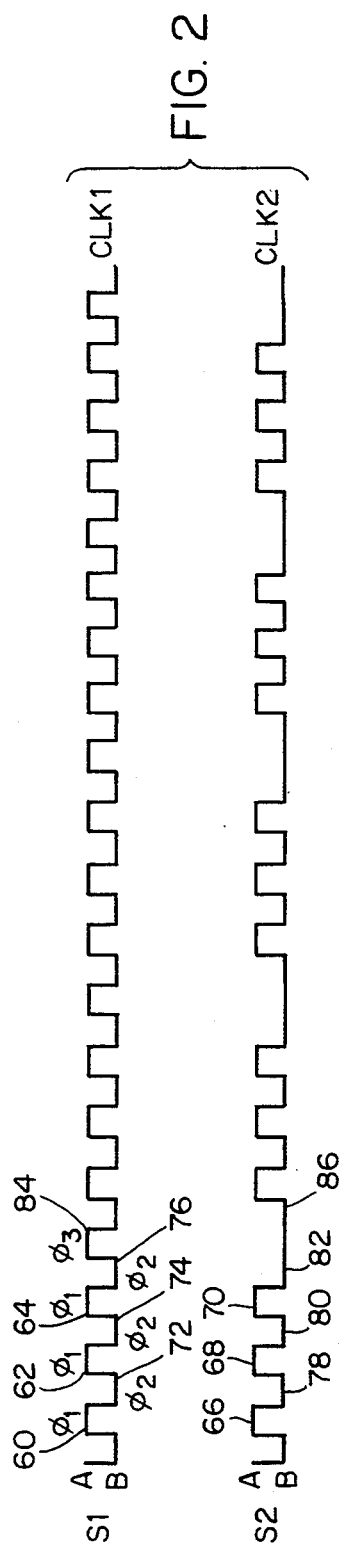
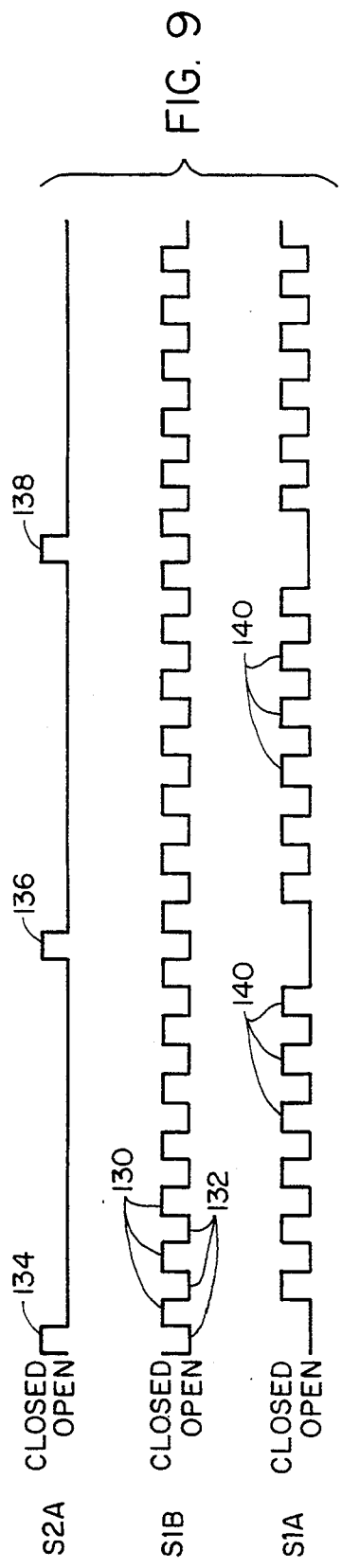
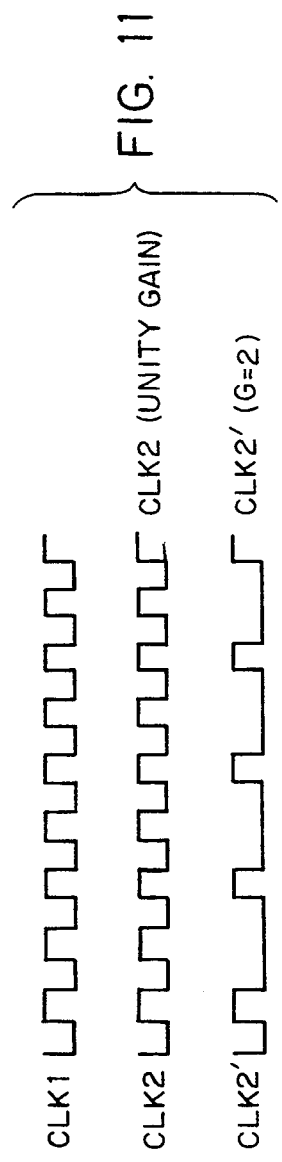

PRECISION SWITCHED CAPACITOR RATIO SYSTEM

FIELD OF INVENTION

This invention relates to a precision switched capacitor ratio system.

BACKGROUND OF INVENTION

Switched capacitors may be used to simulate equivalent resistances in electronic circuits. The equivalent resistance value of a simple switched capacitor is given by $R_{EQ}=1/fc$, where f is the switching frequency and c is the value of the switched capacitance. Current state of the art shows two independent switched capacitors forming a pair of equivalent resistors. The ratio of the equivalent resistors is given by $$\frac{R_{EQ1}}{R_{EQ2}} = \frac{f_2 c_2}{f_1 c_1}.$$

Thus, the ratio is controllable by both the ratio of the switching frequencies and the ratio of the capacitances.

Resistor ratios are commonly used in voltage attenuators, and in feedback configurations, to control a gain value, as well as many other applications. One of the problems with using two independent switched capacitor equivalent resistances is that the ratio of the capacitances determines the equivalent resistance ratio. That is, errors in the capacitor matching correlate directly with errors in the equivalent resistance ratio. Differential drift of the capacitors due to time and temperature also affects the ratio.

SUMMARY OF INVENTION

It is therefore an object of this invention to provide an improved precision switched capacitor ratio system.

It is a further object of this invention to provide such an improved precision switched capacitor ratio system in which the ratios are independent of the capacitance.

It is a further object of this invention to provide an improved precision switched capacitor ratio system in which the ratios are dependent on the relative frequencies which are easily programmable with a high level of precision.

It is a further object of this invention to provide an improved precision switched capacitor ratio system which uses only one capacitor to obtain multiple switched capacitor equivalent resistances.

It is a further object of this invention to provide an improved precision switched capacitor ratio system which can be used to implement a resistor attenuator or voltage divider having a programmable divider ratio which is insensitive to time, temperature and capacitance changes.

It is a further object of this invention to provide an improved precision switched capacitor ratio system which implements a programmable gain network.

It is a further object of this invention to provide an improved precision switched capacitor ratio system which implements a multiple output current source circuit with precisely programmable current ratios.

This invention features a precision switched capacitor ratio system which includes a capacitor and switching means for selectively interconnecting the capacitor with one of a plurality of charging circuits and alternately connecting it with a discharge circuit for discharging the capacitor between each interconnection with a charging circuit. An integrating device interconnects with the capacitor for averaging the current during the charging and discharging of the capacitor for defining the switch capacitor equivalent resistance. The clock device provides synchronized clock signals for operating the switching means to precisely define the ratio of the frequencies of the interconnection of the capacitor with each of the charging circuits.

In a preferred embodiment the capacitor is a low dielectric absorption capacitor. The switching means may include a first switching device interconnected with one end of the capacitor and a second switching device interconnectexl with the other end of the capacitor. Each switching device may include a first terminal for connection with the discharge circuit and at least one terminal for connection with each of the plurality of charging circuits. The clock device may provide at least one clock signal for driving each of the switching devices. The switching means may include a switching device connected with one end of the capacitor and having a terminal for connection with the discharge circuit and at least one terminal for connection with each of the charging circuits. The integrating device may be interconnected with the capacitor through the switching means. The integrating device may be interconnected with each of the charging circuits. The integrating device may include a plurality of integrating elements, one interconnected with each of the charging circuits. The clock device may provide a clock signal for operating each of the switching devices independently.

DISCLOSURE OF PREFERRED EMBODIMENT

Other objects, features and advantages will occur to those skilled in the art from the following description of a preferred embodiment and the accompanying drawings, in which:

FIG. 2 is an illustration of the waveforms of the clock signals provided by the clock to drive the switching devices of FIG. 1;

FIG. 9 is an illustration of tile waveforms provided by the clock circuit of FIG. 8 to drive the switching device;

FIG. 11 is an illustration of the waveforms which may be provided by the clock in FIG. 10.

Figure 1:
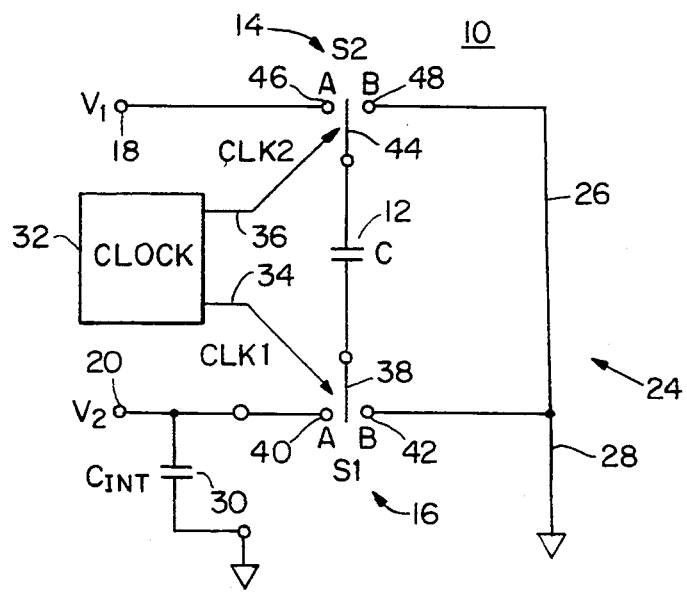
FIG. 1 is a schematic diagram of a precision switched capacitor ratio system according to this invention.
Figure 3:
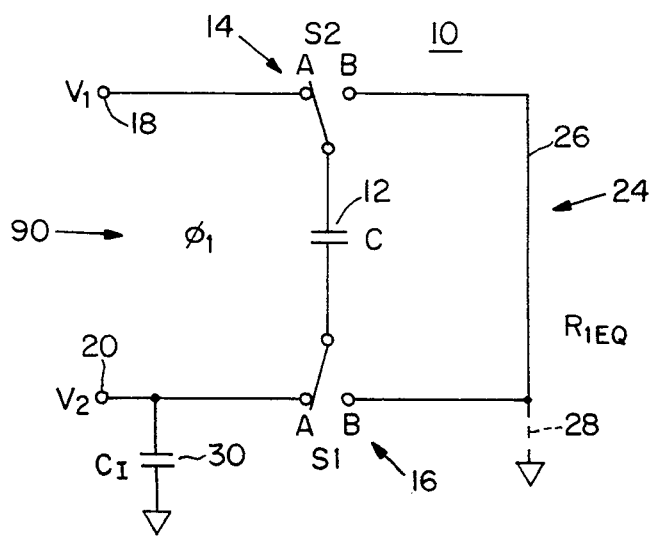
FIG. 3 is a schematic diagram showing the circuit of FIG. 1 with the switch in the $\Phi 1$ position.
Figure 4:
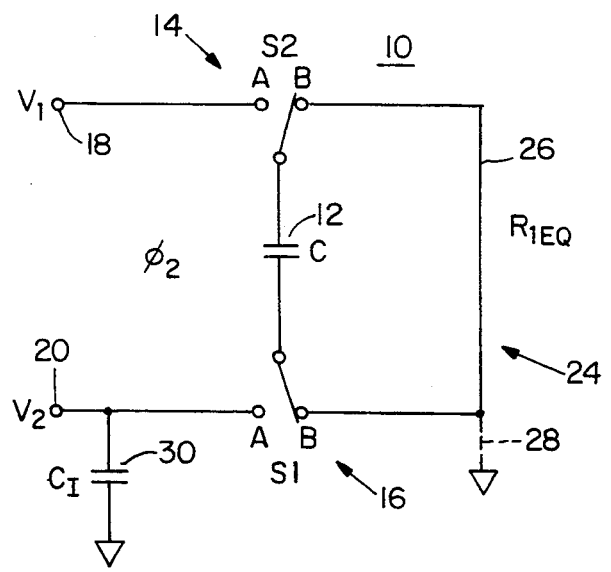
FIG. 4 is a view similar to FIG. 3 with the switches in the $\Phi 2$ position.

There is shown in FIG. 1 a precision switched capacitor ratio system 10 according to this invention which includes a capacitor 12 and switching means including switching device 14 and switching device 16 which interconnect capacitor 12 with charging terminals 18 and 20, $V_1$, $V_2$, respectively, and with discharge circuit 24 implemented here with a simple shunting or short circuit line 26 which in this particular implementation is grounded as at 28. Capacitor 12 may be a low dielectric absorption capacitor. An integrating device such as integrating capacitor 30 is provided to average or smooth out the current pulses produced by capacitor 12 under control of switches 14 or 16 so that the average current flow represents the current through an equivalent resistance represented by the switched capacitor 12. Clock 32 provides two clock signals on lines 34 and 36. Clock signal 1 drives the swinger contact 38 of switch S1 16 so that it moves between two contacts 40 and 42 designated A and B, respectively. Clock signal 2 on line 36 operates swinger 44 to move between contacts 46 and 48 denominated as A and B in switch S2 14, respectively. The clock 1 signal provided to switch S1 16 is shown in FIG. 2 as consisting of a continuous series of high and low levels, where the high levels drive the swinger 38 to position A and the low levels drive it to position B. The other drive signal, clock signal 2, drives the swinger 44 of switch S2 14. The high levels once again drive swinger 44 to the A state and the low levels drive it to the B state. However, clock signal 2 is missing every fourth positive pulse. Thus for every twenty pulses, for example, of clock 1 where n=20, S2 is in position A fifteen times (d=15) and in position B five times (n−d=5). Thus the ratio of $V_2$ to $V_1$ is equal to d/n which is equal to 15/20 or 0.75. This ratio of 3:4 and 15:20 is chosen as an example for simplicity only. Any pulse ratio can be selected to create any divider ratio desired. Clock 32 can be implemented by a Texas Instruments 7497 binary rate multiplier so that the ratio can be precisely digitally defined. The particular ratio is determined by the selection of the frequency of clock signal 1 and clock signal 2. Although in FIG. 2 clock signal 2 is shown with every fourth pulse missing, this is not a necessary limitation of the invention. For example, there could be two pulses missing after every six pulses or four pulses missing after every twelve pulses. The manner of obtaining the ratio is arbitrary. The lowest factor implementation of the ratio is desirable in order to provide a lower amplitude ripple which is more easily filtered out, which in the first instance is accomplished by the integration device, capacitor 30, in FIG. 1.

Figure 5:
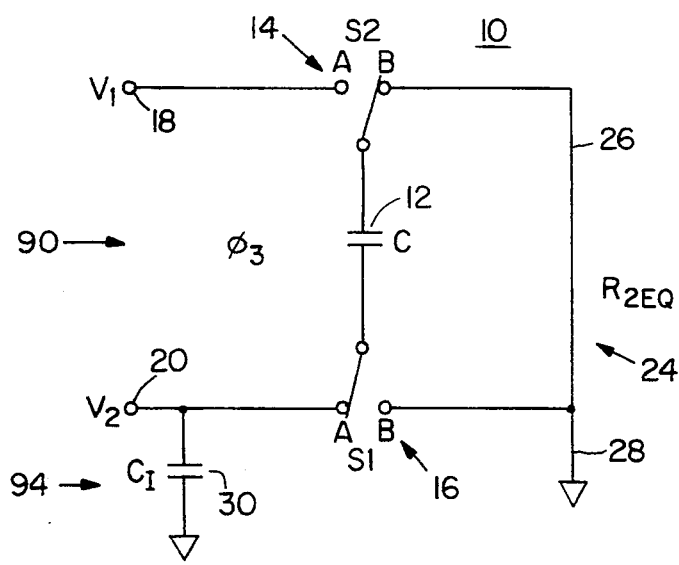
FIG. 5 is a view similar to FIG. 3 with the switches in the $\Phi 3$ position.
Figure 6:
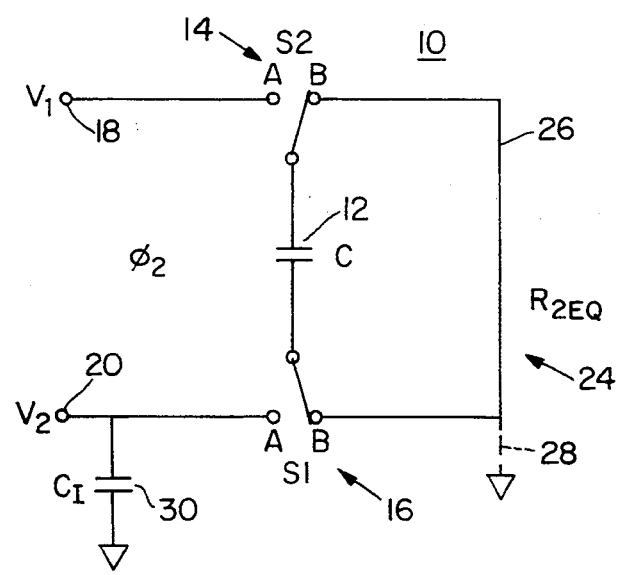
FIG. 6 is a view similar to FIG. 3 with the switches again in the $\Phi 2$ position.

The various combinations of positions of the swingers 38 and 40 of switch devices 14 and 16 in FIG. 1 are referred to as Φ1, Φ2 and Φ3. These conditions are explained more readily with reference to clock signals 1 and 2 in FIG. 2, where Φ1 is represented by the simultaneous high levels A of the first three pulses 60, 62 and 64 of clock signal 1 which occur simultaneously with the high levels of clock pulses 66, 68 and 70. The interstitial low levels 72, 74, 76 and 78, 80 and 82 represent the Φ2 condition, while Φ3 is represented by the high level 84 of clock signal 1 in conjunction with the low level 86 of clock signal 2. The actual positioning of the switch devices 14 and 16 in conjunction with those phases is shown in FIGS. 3, 4, 5 and 6. In Φ1 both switch device 14 and 16 are shown connected to the A terminal, thereby placing the capacitor across the first charging circuit 90 represented by terminals 18 and 20, $V_1$, $V_2$, respectively, and defining $R_{1EQ}$. In Φ2, FIG. 4, the swingers of both switching devices 14 and 16 are connected to their respective B terminals which discharges capacitor 12 now connected to discharge circuit 24. While the discharge circuit 24 need not be connected to ground during Φ1 and Φ2, it does need to be connected to ground during the Φ3 state as shown in FIG. 5. In Φ3 the swinger of switch 14 is connected to the B terminal while the swinger of switch device 16 is connected to the A terminal. In this condition capacitor 12 is connected to a second charging circuit 94 formed of integrating capacitor 30, $V_2$ terminal 20, and ground 28. This defines the second equivalent resistance $R_{2EQ}$. In the next cycle the system returns to Φ2, FIG. 6, which is identical in every respect with Φ2 in FIG. 4.

Figure 7:
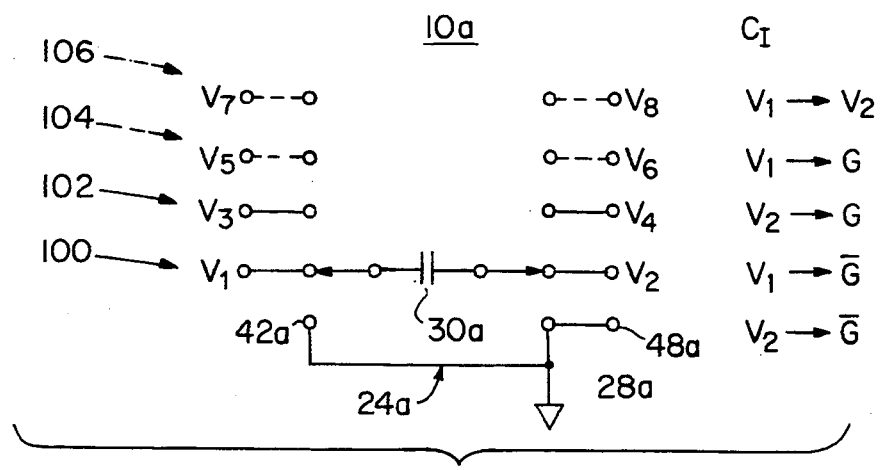
FIG. 7 is a simplified schematic illustrating a precision switched capacitor ratio system according to this invention employed with a number of charging circuits.

Although in FIG. 1 there are but two charging circuits and one discharge circuit shown, this is not a necessary limitation of the invention, for as shown in FIG. 7, the discharge circuit 24a may be employed in conjunction with any number of charging circuits 100, 102, 104, 106, so long as the switching means interconnects capacitor 30a with the discharge circuit 24a in between connection with each of the charging circuits 100, 102, 104, 106, .... Although discharge circuit 24a is shown with a connection to ground 28a, this is not necessary in all applications. In addition, while each of the charging circuits 100, 102, 104, 106, ... are shown as independent of one another, this is not a necessary limitation of the invention. For example, $V_1$ and $V_3$ may be interconnected, or $V_8$ and $V_4$, or any two or more of them may be interconnected without detracting from the concept or the invention, and they may variously be connected to the discharge circuit and/or ground.

Figure 8:
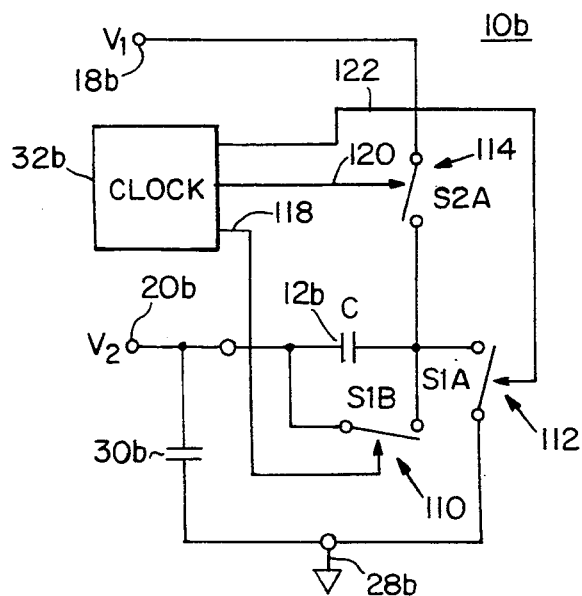
FIG. 8 is a schematic diagram of another embodiment of the precision switched capacitor ratio system according to this invention particularly suitable for integrated circuit fabrication.

This invention may be implemented as shown in FIG. 8, where precision switch capacitor resistor ratio system 10b includes three switching devices 110, 112 and 114, all connected to the same end of capacitor 12b. This is the minimum number of switches that can be employed to implement the invention. Clock circuit 32b provides three signals on lines 118, 120 and 122 to switching devices 110, 114 and 112, respectively. These clock signals on lines 118, 120, 122, are denominated in FIG. 9 as clock signals S2a, S1b and S1a. Once again, arbitrarily for the purposes of example only, using a twenty-pulse cycle, it can be seen that S1b provide a continuous succession of high 130 and low 132 levels. Clock signal S2a provides only three pulses 134, 136 and 138 during that twenty-cycle period, and clock signal S1a provides seventeen positive clock pulses 140 during the same period. Thus out of twenty pulses (n=20), S2a is closed three times (d=3) and S1a is closed seventeen times (n−d=17). Thus V2/V1 is equal to d/n=3/20=0.15.

Figure 10:
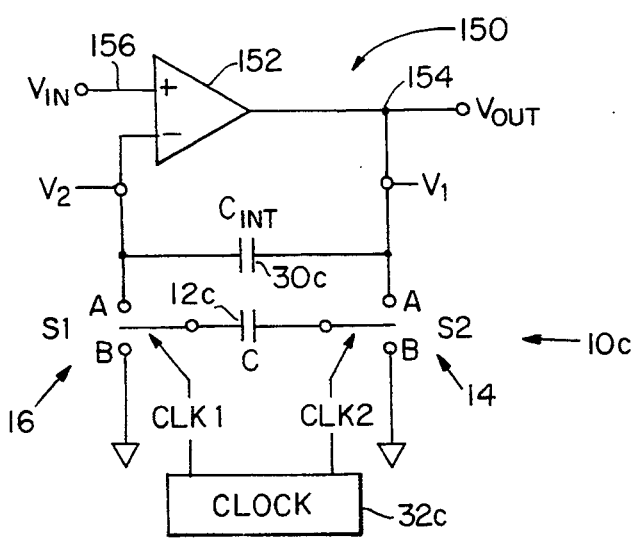
FIG. 10 is a schematic diagram of a precision switched capacitor ratio system according to this invention used in a non-inverting gain op amp circuit.

The precision switch capacitor ratio system 10c according to this invention may be employed in a non-inverting gain op amp circuit 150, FIG. 10, where $V_2$ is interconnected with the negative input to op amp 152, and $V_1$ is connected with the output terminal 154 of op amp 152. The input $V_{in}$ is provided to the positive terminal 156 of op amp 152. In this configuration, capacitor 12c is being used to implement two switched capacitor equivalent resistances, one of which acts as a feedback resistor for op amp 152, the other of which acts as the gain resistor for op amp 152. System 10c operates as system 10, FIG. 1. However, if unity gain is desired then clock signal 1 and clock signal 2 are identical as shown in FIG. 11, and switches 14 and 16 only provide Φ1 and Φ2: Φ3 does not occur. If, however, greater gain is desired, for example, a gain of two, then clock signal 2', FIG. 11, may be provided where the clock signal 2' lacks every other positive-going pulse, thereby reintroducing a Φ3 condition and providing equal frequency occurrence of Φ1 and Φ3. Thus the two switched capacitor equivalent resistances are equal and the gain of op amp 152 is equal to 2. Although this example is explained with respect to a gain of 2, any desired gain can be chosen by simply varying the relative frequency of clock signals 1 and 2.

Figure 12:
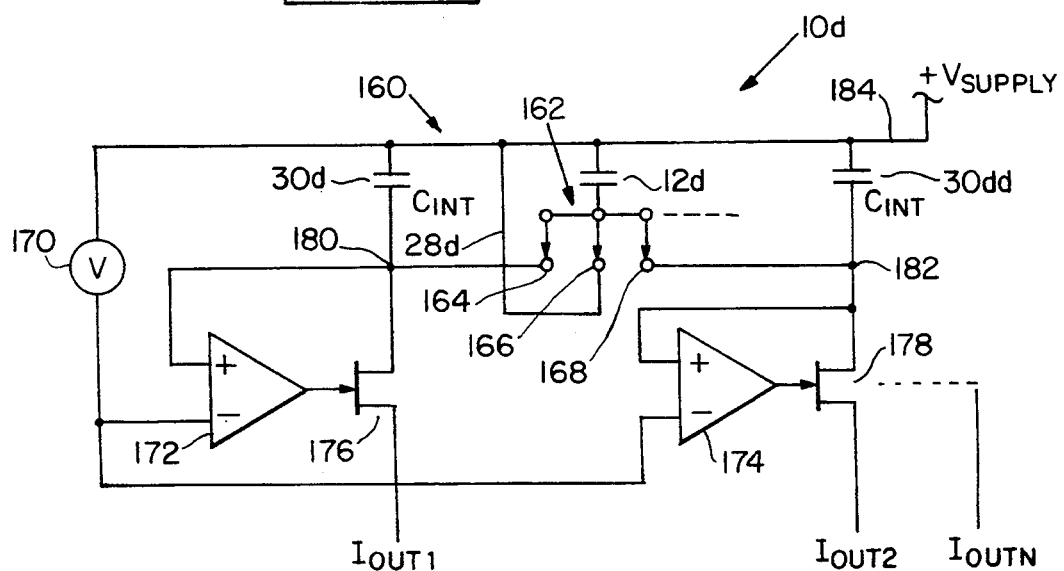
FIG. 12 is a schematic diagram of a multiple current source using the precision switched capacitor ratio system of this invention.

In another application the precision switch capacitor ratio system 10d of this invention, FIG. 12, is used in a multiple current source circuit 160 which provides two or more current sources with precision ratios once again determined by the relative frequencies of the clocks which drive switching means 162 comprised of three or more switching devices 164, 166, 168. In this application a voltage source 170 drives two or more op amps 172, 174 . . . , each of whose outputs is delivered to an FET 176, 178 . . . . Each op amp and FET combination provide a fixed voltage at their respective junctions 180, 182, so that any resistance occurring between that junction and $V_{supply}$ 184 will have a current flowing through it equivalent to the voltage supplied by voltage source 170 divided by that resistance. By using the ratio system 10d according to this invention the single capacitor 12d is used to provide the switched capacitor equivalent resistance in each case so that the current supplied by each of the current generators represented by op amps 172, 174, . . . will have the precise ratio determined by the relative frequencies used to drive switching devices 164, 166, 168, . . . .

Although specific features of this invention are shown in some drawings and not others. this is for convenience only as each feature may be combined with any or all of the other features in accordance with the invention.

Other embodiments and applications for the precision switched capacitor ratio system according to this invention will occur to those skilled in the art and are within the following claims:

What is claimed is:

1. A precision switched capacitor ratio system comprising:
   a capacitor;
   switching means for selectively interconnecting said capacitor with one of a plurality of charging circuits and alternately connecting said capacitor with a discharge circuit for discharging said capacitor between each interconnection with a charging current;
   an integrating device interconnected with said capacitor for averaging the current during the charging and discharging of said capacitor for defining switched capacitor equivalent resistances; and
   a clock device for providing synchronized clock signals for operating said switching means to precisely define a ratio of the frequencies of the interconnection of said capacitor with each of said charging circuits.

2. The precision switched capacitor ratio system of claim 1 in which said capacitor is a low dielectric absorption capacitor.

3. The precision switched capacitor ratio system of claim 1 in which said switching means includes a first switching device interconnected with one end of said capacitor and a second switching device interconnected with the other end of said capacitor.

4. The precision switched capacitor ratio system of claim 3 in which each said switching device includes a first terminal for connection with the discharge circuit and at least one terminal for connection with each of said plurality of charging circuits.

5. The precision switched capacitor ratio system of claim 4 in which said clock device provides at least one clock signal for driving each of said switching devices.

6. The precision switched capacitor ratio system of claim 1 in which said switching means includes a switching device connected with one end of said capacitor and having a terminal for connection with the discharge circuit and at least one terminal for connection with each of the charging circuits.

7. The precision switched capacitor ratio system of claim 1 in which said integrating device is interconnected with said capacitor through said switching means.

8. The precision switched capacitor ratio system of claim 1 in which said integrating device is interconnected with each of the charging circuits.

9. The precision switched capacitor ratio system of claim 1 in which said integrating circuit includes a plurality of integrating elements one interconnected with each of the charging circuits.

10. The precision switched capacitor ratio system of claim 3 in which said clock device provides a clock signal for operating each said switching device independently.

* * * * *